(12) United States Patent
Kuo et al.

(10) Patent No.: US 9,735,348 B2
(45) Date of Patent: *Aug. 15, 2017

(54) HIGH STABILITY SPINTRONIC MEMORY (71) Applicant: Intel Corporation, Santa Clara, CA (US)

(72) Inventors: Charles C. Kuo, Hillsboro, OR (US); Kaan Oguz, Dublin (IE); Brian S. Doyle, Portland, OR (US); Elijah V. Karpov, Santa Clara, CA (US); Roksana Golizadeh Mojarad, San Jose, CA (US); David L. Kencke, Beaverton, OR (US); Robert S. Chau, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/982,128

(22) Filed: Dec. 29, 2015

(65) Prior Publication Data

US 2016/0133829 A1 May 12, 2016

Related U.S. Application Data

(63) Continuation of application No. 13/996,603, filed as application No. PCT/US2013/034506 on Mar. 28, 2013, now Pat. No. 9,231,194.

(51) Int. Cl.
*H01L 43/10* (2006.01)
*H01L 43/12* (2006.01)
(Continued)

(52) U.S. Cl.
CPC ........... *H01L 43/10* (2013.01); *H01F 10/329* (2013.01); *H01F 10/3286* (2013.01);
(Continued)

(58) Field of Classification Search
CPC ......... H01L 43/02; H01L 43/08; H01L 43/10; H01L 43/12; G11C 11/14–11/16; G11C 11/161
See application file for complete search history.

(56) References Cited

U.S. PATENT DOCUMENTS 8,279,666 B2 10/2012 Dieny
8,611,139 B2 12/2013 Yamane
(Continued)

FOREIGN PATENT DOCUMENTS

CN 102246327 11/2011
JP 2006-165265 6/2006
(Continued)

OTHER PUBLICATIONS

Tiawan Intellectual Property Office "Office Action" in application 103110902 Mailed on Jun. 23, 2015.
(Continued)

*Primary Examiner* — Allison P Bernstein
(74) *Attorney, Agent, or Firm* — Trop, Pruner & Hu, P.C.

(57) ABSTRACT

An embodiment includes a magnetic tunnel junction (MTJ) including a free magnetic layer, a fixed magnetic layer, and a tunnel barrier between the free and fixed layers; the tunnel barrier directly contacting a first side of the free layer; and an oxide layer directly contacting a second side of the free layer; wherein the tunnel barrier includes an oxide and has a first resistance-area (RA) product and the oxide layer has a second RA product that is lower than the first RA product. The MTJ may be included in a perpendicular spin torque transfer memory. The tunnel barrier and oxide layer form a memory having high stability with an RA product not substantively higher than a less table memory having a MTJ with only a single oxide layer. Other embodiments are described herein.

19 Claims, 9 Drawing Sheets (51) Int. Cl.
*H01L 43/08* (2006.01)
*H01F 10/32* (2006.01)
*H01L 43/06* (2006.01)
*H01L 43/14* (2006.01)

(52) U.S. Cl.
CPC .............. *H01L 43/08* (2013.01); *H01L 43/12* (2013.01); *H01L 43/065* (2013.01); *H01L 43/14* (2013.01)

(56) References Cited

U.S. PATENT DOCUMENTS

| | | |
|---|---|---|
| 8,796,797 B2 | 8/2014 | Doyle |
| 2008/0310219 A1 | 12/2008 | Chen |
| 2011/0133299 A1 | 6/2011 | Zhu et al. |
| 2011/0222335 A1 | 9/2011 | Yoshikawa et al. |
| 2011/0233700 A1 | 9/2011 | Hayakawa et al. |
| 2011/0303997 A1 | 12/2011 | Wang |
| 2012/0205758 A1 | 8/2012 | Jan |
| 2012/0280336 A1 | 11/2012 | Jan |
| 2012/0287696 A1 | 11/2012 | Ohmori et al. |
| 2012/0313191 A1 | 12/2012 | Whig |
| 2013/0062715 A1* | 3/2013 | Chen ............ G11C 11/161 257/421 |
| 2013/0230741 A1 | 9/2013 | Wang |
| 2013/0307097 A1 | 11/2013 | Yi |
| 2014/0001586 A1 | 1/2014 | Shen |
| 2014/0021426 A1 | 1/2014 | Lee |
| 2014/0061828 A1 | 3/2014 | Lim |

FOREIGN PATENT DOCUMENTS

| | | |
|---|---|---|
| JP | 2012-238631 | 12/2012 |
| TW | 201131845 | 9/2011 |

OTHER PUBLICATIONS

Li, Hai, et al, "An Overview of Non-Volatile Memory Technology and the Implication for Tools and Architectures" Alternative Technology Group, 2009, 731-736, Bloomington, MN, USA.

Dorrance, Richard, et al. "Scalability and Design-Space Analysis of a 1T-1 MTJ Memory Cell" IEEE International Symposium on Nanoscale Architectures, 2011, pp. 32-36.

Deak, J.G., et al., "Effect of Resistance-Area-Product and Thermal Environment on Writing of Magneto-Thermal MRAM" IEEE, Mar. 13, 2006, 4 pages.

International Search Report and Written Opinion in International Application No. PCT/US2013/034506 mailed Dec. 30, 2013.

Taiwan Intellectual Property Office, Decision of Rejection mailed Jan. 14, 2016 in Taiwanese Patent Application No. 103110902. (Translation Redacted).

Taiwan Intellectual Property Office, Office Action mailed Jan. 11, 2017 in Taiwanese Patent Application No. 103110902.

Japan Patent Office, Non Final Notice of Reasons for Rejection dated Jan. 30, 2017, in Japanese Patent Application No. 2016-505444.

State Intellectual Property Office of The People's Republic of China, First Office Action dated Apr. 28, 2017 in Chinese Patent Application No. 201380074016.0.

\* cited by examiner

HIGH STABILITY SPINTRONIC MEMORY

This application is a continuation of U.S. patent application Ser. No. 13/996,603, filed Jun. 21, 2013, which is a §371 National Stage Entry of International Application No. PCT/US2013/034506, filed Mar. 28, 2013. The content of each of the above applications is hereby incorporated by reference.

TECHNICAL FIELD

Embodiments of the invention are in the field of semiconductor devices and, in particular, highly stable spintronic memory.

BACKGROUND

Figure 1:
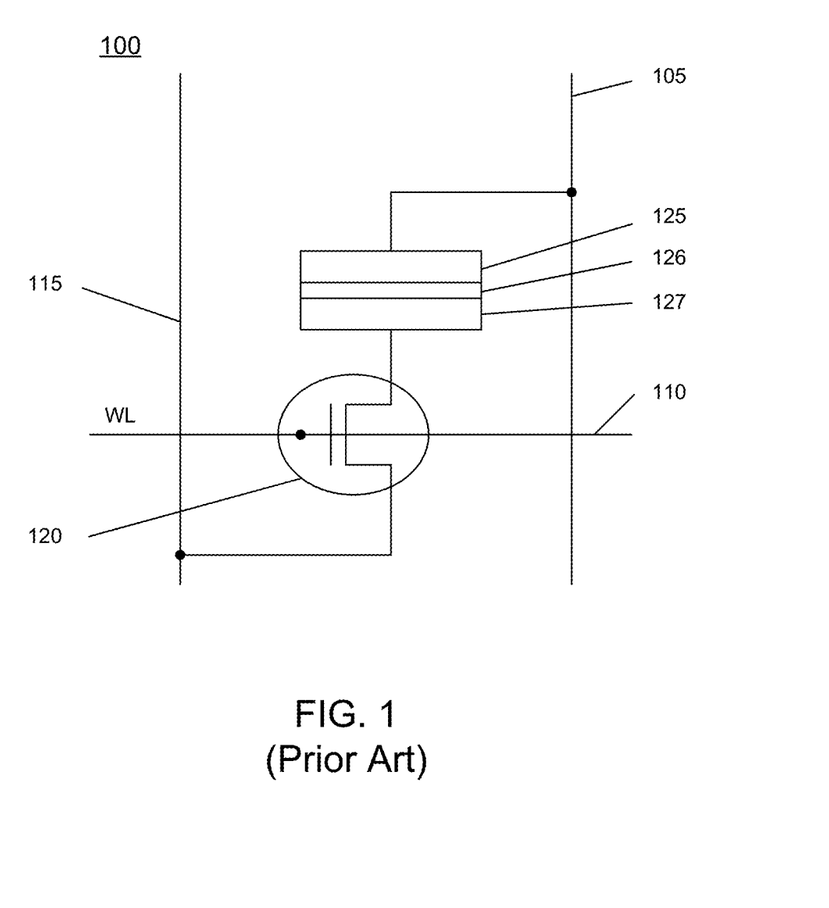
FIG. 1 depicts a conventional magnetic memory cell.

Some magnetic memories, such as a spin transfer torque memory (STTM), utilize a magnetic tunnel junction (MTJ) for switching and detection of the memory's magnetic state. FIG. 1 includes spin transfer torque random access memory (STTRAM), a form of STTM. FIG. 1 includes a MTJ consisting of ferromagnetic (FM) layers 125, 127 and tunneling barrier 126 (e.g., magnesium oxide (MgO)). The MTJ couples bit line (BL) 105 to selection switch 120 (e.g., transistor), word line (WL) 110, and sense line (SL) 115. Memory 100 is "read" by assessing the change of resistance (e.g., tunneling magnetoresistance (TMR)) for different relative magnetizations of FM layers 125, 127.

More specifically, MTJ resistance is determined by the relative magnetization directions of layers 125, 127. When the magnetization directions between the two layers are anti-parallel, the MTJ is in a high resistance state. When the magnetization directions between the two layers are parallel, the MTJ is in a low resistance state. Layer 127 is the "reference layer" or "fixed layer" because its magnetization direction is fixed. Layer 125 is the "free layer" because its magnetization direction is changed by passing a driving current polarized by the reference layer (e.g., a positive voltage applied to layer 127 rotates the magnetization direction of layer 125 opposite to that of layer 127 and negative voltage applied to layer 127 rotates the magnetization direction of layer 125 to the same direction of layer 127).

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

STTRAM, described above, is just one example of "beyond CMOS" technology (or "non-CMOS based" technology), which relates to devices and processes not entirely implemented with complementary metal-oxide-semiconductor (CMOS) techniques. Beyond CMOS technology may rely on spin polarization (which concerns the degree to which the spin or intrinsic angular momentum of elementary particles is aligned with a given direction) and, more generally, spintronics (a branch of electronics concerning the intrinsic spin of an electron, its associated magnetic moment, and the electron's fundamental electronic charge). Spintronics devices may concern TMR, which uses quantum-mechanical tunneling of electrons through a thin insulator to separate ferromagnetic layers, and STT, where a current of spin polarized electrons may be used to control the magnetization direction of ferromagnetic electrodes.

Beyond CMOS devices include, for example, spintronics devices implemented in memory (e.g., 3 terminal STTRAM), spin logic devices (e.g., logic gates), tunnel field-effect transistors (TFETs), impact ionization MOS (IMOS) devices, nano-electro-mechanical switches (NEMS), negative common gate FETs, resonant tunneling diodes (RTD), single electron transistors (SET), spin FETs, nanomagnet logic (NML), domain wall logic, domain wall memory, and the like.

Figure 2:
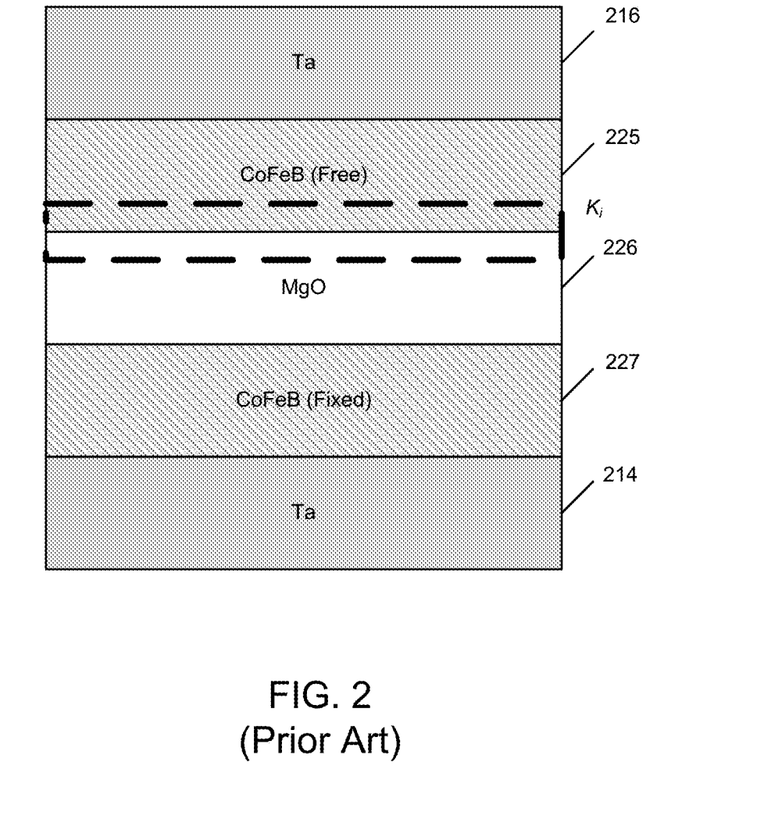
FIGS. 2-3 depict conventional MTJs.

Regarding STTM specifically, one form of STTM includes perpendicular STTM (pSTTM). Where a traditional MTJ or non-perpendicular MTJ generates a magnetization "in plane" (with which "high" and "low" memory states are set), a perpendicular MTJ (pMTJ) generates magnetization "out of plane". This reduces the switching current needed to switch between high and low memory states. This also allows for better scaling (e.g., smaller size memory cells). Traditional MTJs are converted to pMTJs by, for example, thinning the free layer, thereby making the tunnel barrier/free layer interface more dominant in magnetic field influence (and the interface promotes anisotropic out of plane magnetization). The interface is highlighted with bold dashed lines and $K_i$ in FIG. 2 (and other figures included herein) which addresses the anisotropic energy at the interface. FIG. 2 includes such a system with CoFeB free layer 225 interfacing MgO tunnel barrier 226, which further couples to CoFeB fixed layer 227 and Tantalum (Ta) contacts 214 (which may couple to a selection switch such as transistor 120 of FIG. 1), 216 (which may couple, by way of one or more vias, to a bit line such as bit line 105 of FIG. 1).

Figure 3:
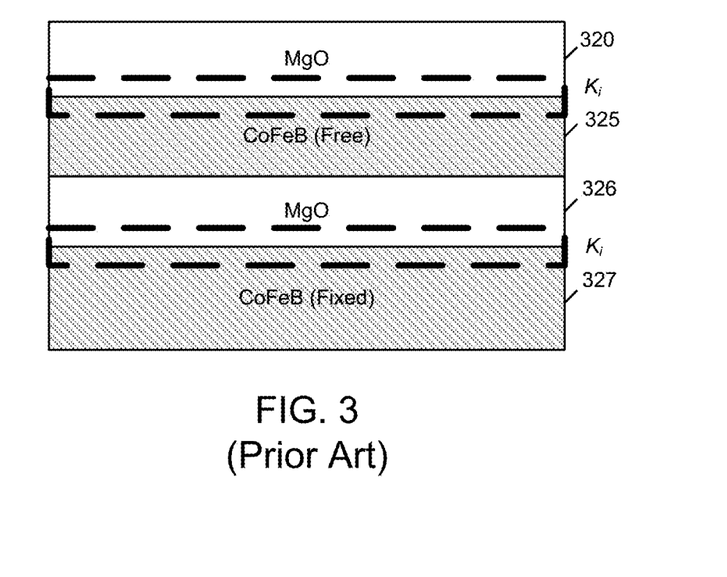

FIG. 3 depicts a MTJ, where a second oxidized MgO interface 320 contacts CoFeB free layer 325 (which further couples to a tunnel barrier MgO 326, which is formed on CoFeB fixed layer 327). Doing so may increase stability for the memory, which is a problem for devices such as the device of FIG. 2. Thus, FIG. 3 includes MgO at both free layer interfaces (i.e., layers 320, 326). However, introducing MgO layer 320 on top of CoFeB free layer 325 increases total resistance significantly (as compared to having just one oxide layer interface the free layer as in FIG. 2), which makes the design impractical for scaled devices (e.g., 22 nm) because of degradation in resistance-area (RA) product and TMR. In other words, if MgO layer 326 is predominately responsible for resistance and voltage drop in conventional MTJs, adding yet another layer of MgO in series with layer 326 increases RA product, thereby driving up write voltage, decreasing battery life, and the like.

RA product refers to a measurement unequal to resistivity. Resistivity has units in ohm-cm, whereas RA product=$\rho T_{MgO}/A*A \propto T_{MgO}$, with units in ohm-um$^2$ (p represents the material resistivity, A represents the dot area, and $T_{MgO}$ represents the MgO thickness). While resistivity represents an "inherent resistance" and is independent of the thickness of a material layer, RA product is directly proportional to the thickness of the material. (Regarding "thickness", layer 320 is disposed "horizontally" for purposes of discussion herein and has a "thickness" in the vertical orientation. The length and width for layer 320 are "in plane" and the height or thickness is "out of plane".)

Thus, returning to FIG. 3, a higher RA product increases STTM resistance. While this does not necessarily increase write current, a higher RA product does increase write voltage (write voltage=Jc*RA product)(Jc refers to a critical switching current density to write a bit). Also, a larger STTM resistance degrades current provided by a select transistor (e.g., MOS transistor 120 of FIG. 1) since the Gate-to-Source voltage is smaller due to the larger IR drop across the STTM resistance.

Figure 4:
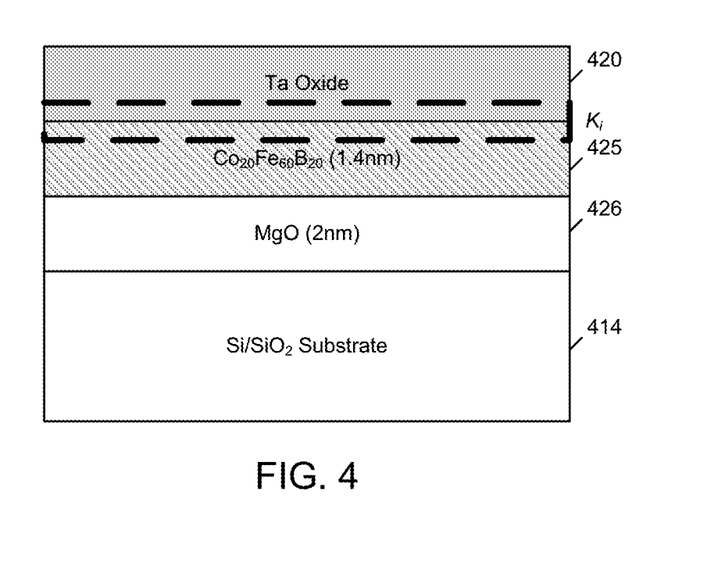
FIG. 4 includes an MTJ portion in an embodiment of the invention.

FIG. 4 differs from FIG. 3, however, and includes an MTJ portion in an embodiment of the invention having an oxidized layer that includes tantalum oxide (TaO) interface 420. This increases stability for the device without increasing RA product too much. Layer 420 contacts $Co_{20}Fe_{60}B_{20}$ free layer 425, which further couples to MgO layer 426, a substrate (layer 414), and other layers not necessarily shown. (The stack in FIG. 4 was used to generate the EHE data of FIG. 5, which is discussed below. No fixed layer is included in the stack in order to better focus on the EHE effects of adding the second oxide on the free layer. The presence of the fixed layer would not have aided in generating the data of FIG. 5.) "Second oxide film" 420 (i.e., a second oxide film in addition to tunnel barrier, which constitutes a "first oxide film") enhances thermal stability (strength) of free layer 425, thereby decreasing the odds of faulty high/low or low/high memory state conversions. The insertion of oxide layer 420 may be included with CoFeB free film 425, which could have already been thinned to further promote anisotropic magnetic properties for the pSTTM.

For example, layer 425 is primarily located in the horizontal plane and free layer 425 has a thickness, orthogonal to the plane (vertical dimension), of less than 2 nm while oxide layer 426 has a thickness less than 3 nm (and greater than the thickness of free layer 425). In an embodiment layer 426 may include a thickness of about 1 nm, with an RA product of about 10 ohm-um$^2$. Layer 426 thickness may be thicker or thinner (and consequently RA product can vary around 10 ohm-um$^2$ as well) in other embodiments. Some embodiments may include a 2-3 nm thick layer 426. Free layer 425 thickness may be around 1-2 nm, but other embodiments are not so limited. Layer 420 may vary accordingly to gain an RA product much less than the RA product of layer 426 (e.g., so series resistance addition is negligible or low). For example, an embodiment may include an RA product of 10 ohm-um$^2$ for layer 426 (e.g., MgO) and an RA product 10× lower for layer 420 so the effect of layer 420 on electrical resistance is much smaller than that of layer 426. These same dimensions are applicable to other embodiments described herein (e.g., FIG. 6) and are not limiting on all embodiments.

Thus, FIG. 4 is an example of a more general concept for embodiments of the invention whereby a high conductivity oxide, such as layer 420, is formed next to an interface of CoFeB free layer 425. This induces large stability without unnecessarily degrading RA product and TMR (as is the case with the dual MgO layers found in FIG. 3). In other words, this induces greater stability without overly increasing RA product (which may adversely affect write/read voltages) or diminishing TMR (which may complicate accurate reads of memory states). The other interface to CoFeB free layer 425 is MgO spin filter 426 (i.e., tunnel barrier).

Figure 5:
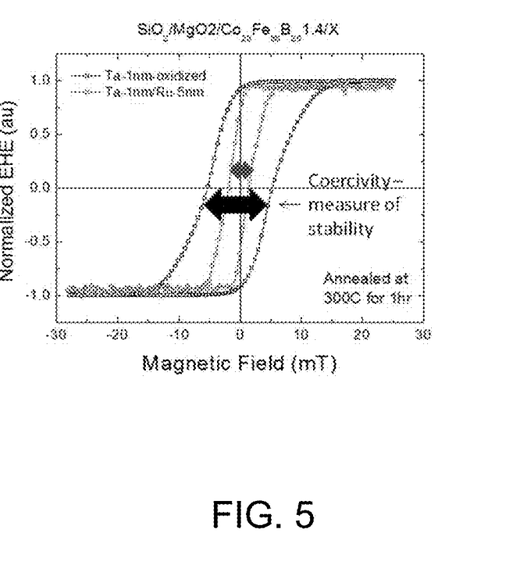
FIG. 5 demonstrates how stability increases for an embodiment of the invention.

FIG. 5 demonstrates stability increases for the embodiment of FIG. 4. FIG. 5 concerns a free layer connected to tantalum (Ta) and a tunnel barrier (see circle plot points) compared to a free layer connected to tantalum oxide (TaO) and a tunnel barrier (see square plot points). In the unoxidized case (circle plot points) there is a Ruthenium (Ru) cap above the Ta. The narrow gap for the tunnel barrier/free layer/Ta/Ru arrangement has a very narrow horizontal band that shows a quick Extraordinary Hall Effect (EHE) transition over a short magnetic field deviation (indicating low stability or coercivity). In contrast, the broader horizontal gap for the tunnel barrier/free layer/TaO arrangement has a broader band that shows a more tolerant EHE transition over a broader magnetic field deviation (indicating higher stability or coercivity). As shown in FIG. 5, the barrier/free layer/TaO arrangement has a 4× coercivity improvement over the tunnel barrier/free layer/Ta/Ru arrangement.

This second oxidized interface (interface between layers 425, 420) can be designed with an RA product much lower than the RA product for the tunnel barrier. Thus, a high-conductivity oxide (i.e., lower RA product) on top of a free layer can lead to greater stability. Embodiments provide the conductive oxide of layer 420 may be 100-1000× less conductive than the tunnel barrier. For example, tunnel barrier MgO may have a resistivity of about 1 ohm-cm. In contrast, the high conductivity oxide may include, for example, any one or more of the following: tungsten oxide ($WO_2$), vanadium oxide (VO and/or $V_2O_2$), indium oxide (InOx), aluminum oxide ($Al_2O_3$), ruthenium oxide (RuOx), and/or TaO. For example, $In_2O_3$ includes a tunable resistivity of 1-10 mOhm-cm, $VO_2$ and $V_2O_3$ include resistivity less that 1 mOhm-cm, $WO_2$ includes resistivity less than 1 mOhm-cm, and tin (Sn) doped $In_2O_3$ (ITO) includes resistivity less than 0.1 mOhm-cm.

Figure 6:
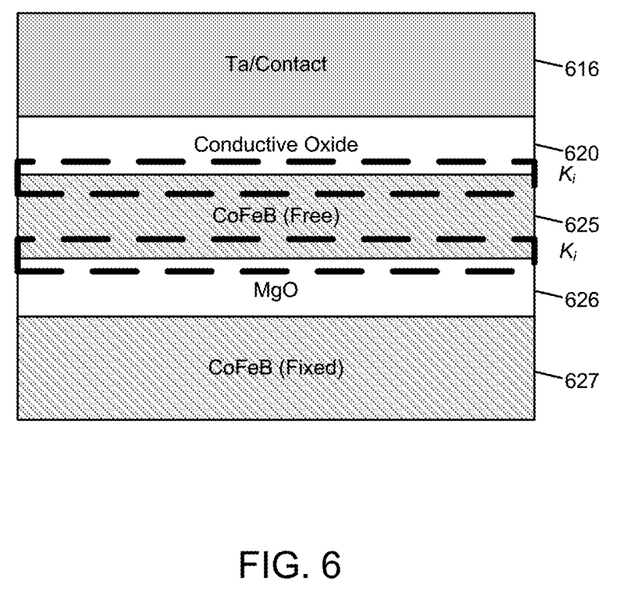
FIG. 6 includes an MTJ portion in an embodiment of the invention.

FIG. 6 shows second barrier 620 placed between CoFeB 625 and Ta contact 616. Free layer 625 is on tunnel barrier 626 and fixed layer 627.

Figure 7:
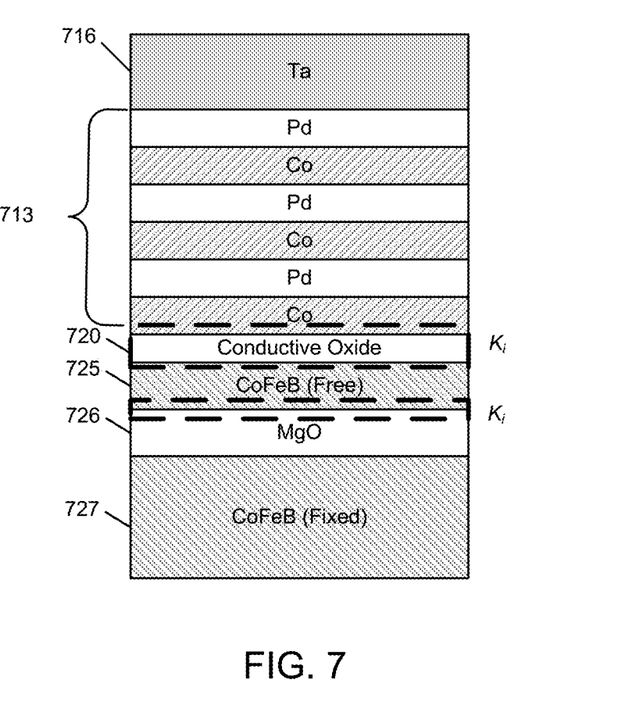
FIG. 7 includes an MTJ with a multi-layer stack in an embodiment of the invention.

FIG. 7 shows second oxide barrier 720 placed between CoFeB 725 and a multi-layer arrangement 713 including alternating Cobalt (Co) and Palladium (Pd) layers that help enhance stability for the small film MTJ. Second oxide barrier 720 may be adjacent thinned CoFeB free layer 725, which interfaces first oxide layer MgO spin filter 726 (which is on fixed layer 727 and below Ta contact layer 716). Thinned CoFeB free layer 725 provides a layer with strong spin-orbit coupling to render perpendicular anisotropy.

Thus, various embodiments introduce a second oxidized layer next to the free layer, which enhances stability through dual oxidized interfaces (on top and bottom of the free layer) without adversely affecting RA product or TMR (i.e., overly increasing RA product or overly diminishing TMR). Accordingly, the second oxidized layer has a low RA product as compared to the tunnel barrier. Some embodiments include this second oxidized layer with a free layer and a multi-layer stack.

Figure 8:
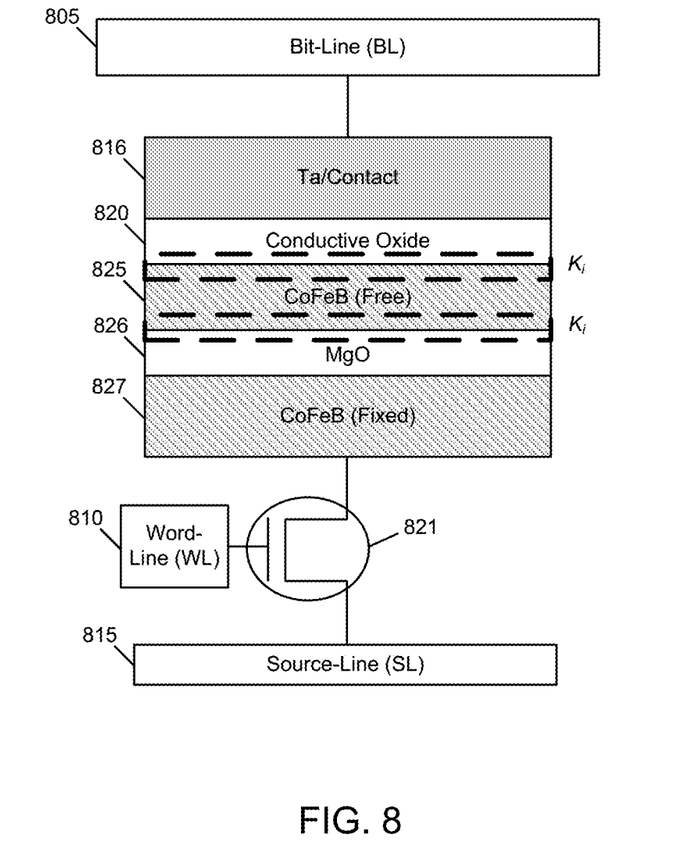
FIG. 8 includes a memory cell in an embodiment of the invention.

FIG. 8 includes a memory cell in an embodiment of the invention. The memory cell includes a 1T-1X (T=transistor, X=capacitor or resistor) at a small cell size. The MTJ comprises fixed/free layers 827, 825, tunnel barrier 826, and oxide layer 820. The MTJ couples bit line 805 to selection switch 821 (e.g., transistor), word line 810, and sense line 815. The MTJ may be located on a substrate.

In an embodiment, the substrate is a bulk semiconductive material as part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material. There may be one or more layers between the MTJ and the substrate. There may be one or more layers above the MTJ.

Figure 10:
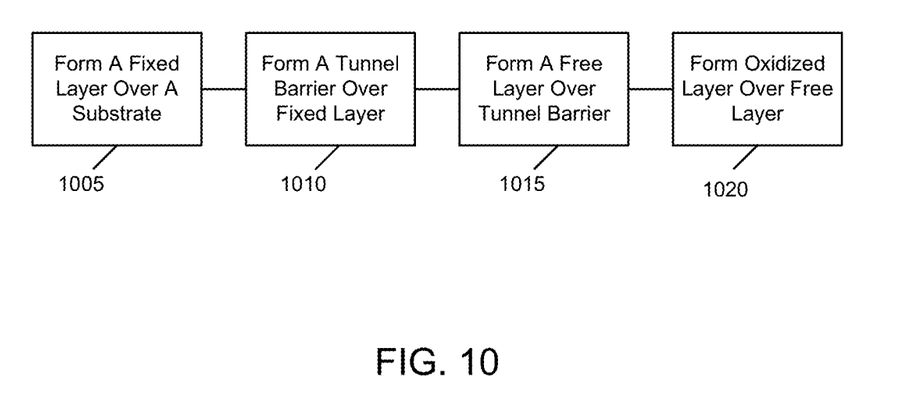
FIG. 10 depicts a method of forming a memory in an embodiment of the invention.

An embodiment includes a method 1000 of forming an apparatus (FIG. 10). In block 1005 a fixed layer of a MTJ is formed over a substrate. In block 1010 a tunnel barrier (first oxide layer) is formed over the fixed layer. In block 1015 a free layer is formed over the tunnel barrier. In block 1020 an oxidized layer (second oxide layer) is formed on the free layer. The free and fixed layers, the tunnel barrier, and the oxidized layer are all thin films (a layer less than several micrometers in thickness). In an embodiment there is no vacuum break between the CoFeB formation and second oxide deposition. A vacuum break may lead to uncontrollable oxidation/degradation of the thin CoFeB. Thus, the entire stack is deposited in-situ (without vacuum breaks) in an embodiment.

While several embodiments herein describe perpendicular STTM, other embodiments are not so limited and may concern in plane (non-perpendicular) STTM, as well as embodiments that are neither fully in plane (non-perpendicular) or fully out of plane (perpendicular) but are instead something in between in plane and out of plane.

At times herein a first oxide layer is said to "directly contact" the tunnel barrier layer and/or a first side of the free layer; and a second oxide layer "directly contacts" a second side of the free layer. This includes situations where one considers, for example, an oxide layer to be a sublayer of either the tunnel barrier and/or the free layer. This includes situations where one considers, for example, an oxide layer to be some or all of the tunnel barrier. Further, the tunnel barrier may include oxide but may further include further oxidation at its surface/interface to the free layer. Such a situation would still comprise an oxide layer contacting both the free layer and the tunnel barrier. Further, for example, there can be some oxidation of the CoFeB layer during the formation of the second metal oxide.

In an embodiment the metal oxide (second oxide layer) is directly in contact with the second side (e.g., upper side) of the free layer. The contact create an interface anisotropy (represented by Ki in the figures), which adds to the thermal stability of the CoFeB free layer.

While several embodiments include fixed and free layers comprising CoFeB, other embodiments may include CoFe/CoFeB; CoFeB/Ta/CoFeB; or CoFe/CoFeB/Ta/CoFeB/CoFe. Further, other embodiments may include tunnel barriers having something other than MgO, such as other oxides.

Figure 9:
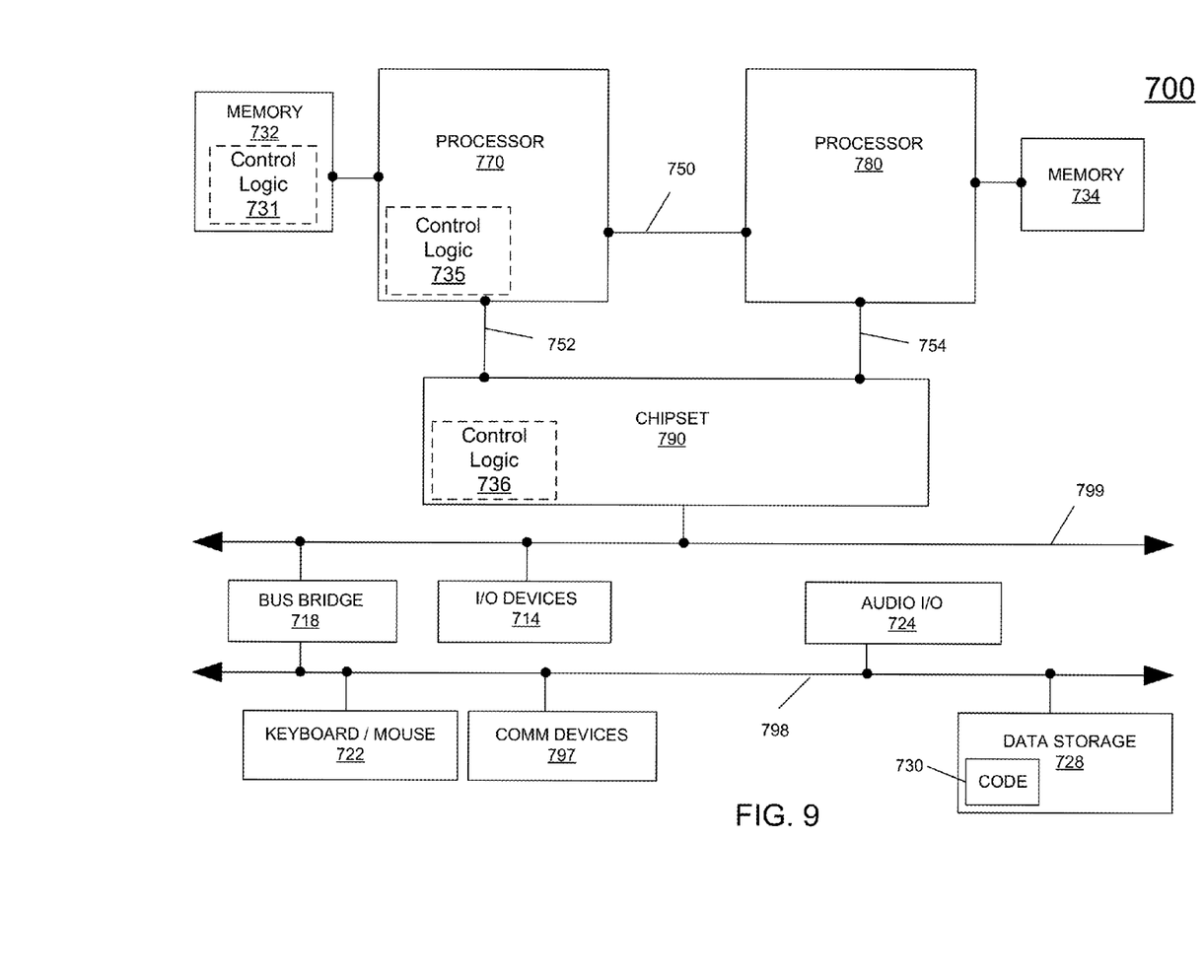
FIG. 9 depicts a system for use with embodiments of the invention.

Embodiments may be used in many different types of systems. For example, in one embodiment a communication device (e.g., cell phone, Smartphone, netbook, notebook, personal computer, watch, and camera) can be arranged to include various embodiments described herein. Referring now to FIG. 9, shown is a block diagram of a system in accordance with an embodiment of the present invention. Multiprocessor system 700 is a point-to-point interconnect system, and includes a first processor 770 and a second processor 780 coupled via a point-to-point interconnect 750. Each of processors 770 and 780 may be multicore processors including, for example, embedded non-volatile memory such as pSTTM described herein. First processor 770 may include a memory controller hub (MCH) and point-to-point (P-P) interfaces. Similarly, second processor 780 may include a MCH and P-P interfaces. The MCHs may couple the processors to respective memories, namely memory 732 and memory 734, which may be portions of main memory (e.g., a dynamic random access memory (DRAM) or pSTTM described herein) locally attached to the respective processors. However, the processors may be located on the same chip as memory described herein. First processor 770 and second processor 780 may be coupled to a chipset 790 via P-P interconnects, respectively. Chipset 790 may include P-P interfaces. Furthermore, chipset 790 may be coupled to a first bus 799 via an interface. Various input/output (I/O) devices 714 may be coupled to first bus 799, along with a bus bridge 718, which couples first bus 799 to a second bus 798. Various devices may be coupled to second bus 798 including, for example, a keyboard/mouse 722, communication devices 797, and data storage unit 728 such as a disk drive or other mass storage device, which may include code 730, in one embodiment. Code may be included in one or more memories including memory 728, 732, 734, memory coupled to system 700 via a network, and the like. Further, an audio I/O 724 may be coupled to second bus 798.

The following examples pertain to further embodiments.

An Example includes an apparatus comprising: a magnetic tunnel junction (MTJ) including a free magnetic layer, a fixed magnetic layer, and a tunnel barrier between the free and fixed layers; the tunnel barrier directly contacting a first side of the free layer; and an oxide layer directly contacting a second side of the free layer; wherein the tunnel barrier includes an oxide and has a first resistance-area (RA) product and the oxide layer has a second RA product that is lower than the first RA product.

In another example, the subject matter of the previous examples can optionally include wherein the tunnel barrier includes magnesium oxide and the oxide layer includes at least one of tungsten oxide, vanadium oxide, indium oxide, aluminum oxide, ruthenium oxide, and tantalum oxide.

In another example, the subject matter of the previous examples can optionally include wherein the second RA product is less than 10 mOhm-cm².

In another example, the subject matter of the previous examples can optionally include wherein the second side is primarily located in a plane and the free layer has a thickness, orthogonal to the plane, of less than 2 nm.

In another example, the subject matter of the previous examples can optionally include wherein the tunnel barrier has a thickness less than 3 nm and greater than the thickness of the free layer.

In another example, the subject matter of the previous examples can optionally include wherein the free layer includes cobalt, iron, and boron.

In another example, the subject matter of the previous examples can optionally include perpendicular spin torque transfer memory (STTM) that includes the MTJ.

In another example, the subject matter of the previous examples can optionally include wherein the second side is in a plane and the free layer has a thickness, orthogonal to the plane, less than a thickness of the tunnel barrier layer.

In another example, the subject matter of the previous examples can optionally include wherein the tunnel barrier includes a first metal and the oxide layer includes a second metal unequal to the first metal.

In another example, the subject matter of the previous examples can optionally include wherein the first side is directly opposite the second side.

In another example, the subject matter of the previous examples can optionally include alternating layers of first and second materials, wherein one of the alternating layers directly contacts the oxide layer opposite where the free layer contacts the oxide layer.

In another example, the subject matter of the previous examples can optionally include wherein the oxide layer, the fixed and free layers, and the tunnel barrier are all thin films.

In another example, the subject matter of the previous examples can optionally include wherein the second RA product is less than 10% of the first RA product.

In another example, the subject matter of the previous examples can optionally include wherein the MTJ has perpendicular anisotropy.

Another example includes a method comprising: forming a magnetic tunnel junction (MTJ) on a substrate, the MTJ including a free magnetic layer, a fixed magnetic layer, and a tunnel barrier layer between the free and fixed layers; the tunnel barrier directly contacting a first side of the free layer; and forming an oxide layer directly contacting a second side of the free layer; wherein the tunnel barrier has a first resistance-area (RA) product and the oxide layer has a second RA product that is lower than the first RA product.

In another example, the subject matter of the previous method example can optionally include wherein the oxide layer, the fixed and free layers, and the tunnel barrier are all thin films.

In another example, the subject matter of the previous method examples can optionally include wherein the second side is primarily located in a plane and the free layer has a thickness, orthogonal to the plane, of less than 2 nm and the tunnel barrier layer has a thickness less than 3 nm and greater than the thickness of the free layer.

In another example, the subject matter of the previous method examples can optionally include wherein the second RA product is less than 10% of the first RA product.

Another example includes a perpendicular spin torque transfer memory (STTM) comprising: a magnetic tunnel junction (MTJ) including a tunnel barrier layer between free and fixed layers and directly contacting a side of the free layer; and an oxide layer directly contacting an opposing side of the free layer; wherein the tunnel barrier has a first resistance-area (RA) product and the oxide layer has a second RA product that is lower than the first RA product.

In another example, the subject matter of the previous perpendicular STTM example can optionally include wherein the second RA product is less than 10% of the first RA product.

In another example, the subject matter of the previous perpendicular STTM examples can optionally include wherein the oxide layer, the fixed and free layers, and the tunnel barrier are all thin films.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a magnetic tunnel junction (MTJ) including a free magnetic layer, a fixed magnetic layer, and a tunnel barrier between the free and fixed layers; the tunnel barrier directly contacting a first side of the free layer; and
   an oxide layer directly contacting a second side of the free layer;
   wherein (a) the tunnel barrier includes an oxide and has a first resistance-area (RA) product and the oxide layer has a second RA product that is lower than the first RA product; (b) the first side is directly opposite the second side; (c) the tunnel barrier includes a first metal and the oxide layer includes a second metal unequal to the first metal, and (d) the oxide layer includes at least one of tungsten oxide, indium oxide, and ruthenium oxide.

2. The apparatus of claim 1, wherein the tunnel barrier includes magnesium oxide.

3. The apparatus of claim 2, wherein the second RA product is less than 10 mOhm-cm².

4. The apparatus of claim 3, wherein the second side is primarily located in a plane and the free layer has a thickness, orthogonal to the plane, of less than 2 nm.

5. The apparatus of claim 4, wherein the tunnel barrier has a thickness less than 3 nm and greater than the thickness of the free layer.

6. The apparatus of claim 2, wherein the free layer includes cobalt, iron, and boron.

7. The apparatus of claim 2, wherein the tunnel barrier is less conductive than the oxide layer.

8. The apparatus of claim 1 comprising a perpendicular spin torque transfer memory (STTM) that includes the MTJ.

9. The apparatus of claim 1, wherein the second side is in a plane and the free layer has a thickness, orthogonal to the plane, less than a thickness of the tunnel barrier.

10. The apparatus of claim 1, wherein the second RA product is less than 10% of the first RA product.

11. The apparatus of claim 1, wherein the MTJ has perpendicular anisotropy.

12. The apparatus of claim 1 comprising alternating layers of first and second materials, wherein the first material includes at least one of Co and Pd.

13. The apparatus of claim 12, wherein the second material includes at least one of Co and Pd and is not the same as the first material.

14. A method comprising:
forming a magnetic tunnel junction (MTJ) on a substrate, the MTJ including a free magnetic layer, a fixed magnetic layer, and a tunnel barrier layer between the free and fixed layers; the tunnel barrier directly contacting a first side of the free layer; and
forming an oxide layer directly contacting a second side of the free layer;
wherein (a) the tunnel barrier has a first resistance-area (RA) product and the oxide layer has a second RA product that is lower than the first RA product, (b) the tunnel barrier layer includes a first metal and the oxide layer includes a second metal unequal to the first metal, and (c) the oxide layer includes at least one of tungsten oxide, indium oxide, and ruthenium oxide.

15. The method of claim 14, wherein the second side is primarily located in a plane and the free layer has a thickness, orthogonal to the plane, of less than 2 nm and the tunnel barrier layer has a thickness less than 3 nm and greater than the thickness of the free layer.

16. The method of claim 14, wherein the second RA product is less than 10% of the first RA product.

17. A perpendicular spin torque transfer memory (STTM) comprising:
a magnetic tunnel junction (MTJ) including a tunnel barrier layer between free and fixed layers and directly contacting a side of the free layer; and
an oxide layer directly contacting an opposing side of the free layer;
wherein (a) the tunnel barrier has a first resistance-area (RA) product and the oxide layer has a second RA product that is lower than the first RA product, (b) the tunnel barrier layer includes a first metal and the oxide layer includes a second metal unequal to the first metal; and (c) the oxide layer includes at least one of tungsten oxide, indium oxide, and ruthenium oxide.

18. The memory of claim 17, wherein the second RA product is less than 10% of the first RA product.

19. The memory of claim 17 comprising alternating layers of first and second materials, wherein: (a) the first material includes at least one of Co and Pd and (b) the second material includes at least one of Co and Pd and is not the same as the first material.

* * * * *